United States Patent
CS et al.

(10) Patent No.: US 9,121,877 B2
(45) Date of Patent: *Sep. 1, 2015

(54) SYSTEM AND METHOD FOR WIRELESS REMOTE DISPLAY FOR HIGH VOLTAGE LINE METER

(75) Inventors: Adishesa CS, Karnataka (IN); Ataur Rahman, Andhra Pradesh (IN); Michael D. Berg, Carol Stream, IL (US)

(73) Assignee: Honeywell International Inc., Morristown, NJ (US)

( * ) Notice: Subject to any disclaimer, the term of this patent is extended or adjusted under 35 U.S.C. 154(b) by 308 days.

This patent is subject to a terminal disclaimer.

(21) Appl. No.: 13/235,693

(22) Filed: Sep. 19, 2011

(65) Prior Publication Data

US 2013/0069627 A1 Mar. 21, 2013

(51) Int. Cl.
| | |
|---|---|
| *G01R 25/00* | (2006.01) |
| *G01R 19/00* | (2006.01) |
| *G01R 29/16* | (2006.01) |
| *G01R 19/25* | (2006.01) |
| *H04M 11/00* | (2006.01) |

(52) U.S. Cl.
CPC ............ *G01R 29/16* (2013.01); *G01R 19/2513* (2013.01); *H04M 11/002* (2013.01)

(58) Field of Classification Search
CPC .. G01R 21/133; G01R 29/18; G01R 19/2513; G01R 15/142; G01R 29/16; G01R 25/00; G01R 22/10; G01R 19/0092; H04B 3/54; H04B 2203/5458; H04B 2203/542; H04B 2203/5433; H04B 2203/5441; H04B 2203/5445; H04B 3/542; H04B 3/546; H04B 3/548

See application file for complete search history.

(56) References Cited

U.S. PATENT DOCUMENTS

| | | | |
|---|---|---|---|
| 4,298,837 A | 11/1981 | Koslar | |
| 5,136,234 A | 8/1992 | Shaw | |
| 5,438,255 A | 8/1995 | Binnie | |
| 6,667,610 B2 | 12/2003 | Piesinger | |
| 6,734,658 B1 * | 5/2004 | Bierer | 324/115 |
| 7,031,859 B2 | 4/2006 | Piesinger | |
| 7,109,699 B1 | 9/2006 | Bierer | |
| 2002/0135353 A1 | 9/2002 | Bierer | |
| 2007/0063832 A1 * | 3/2007 | Ollis et al. | 340/510 |
| 2009/0119068 A1 * | 5/2009 | Banting | 702/188 |
| 2011/0080197 A1 * | 4/2011 | Fan et al. | 327/156 |
| 2013/0066576 A1 * | 3/2013 | Cs et al. | 702/67 |

OTHER PUBLICATIONS

Voltmeters/Phasing Sets for Phase-To-Phase & Phase-To-Ground Measurements—HD Electric Company 2008.
Deltex Voltage Detectors and Phasing Testers—Voltage Detectors and Phasing Testers.

* cited by examiner

*Primary Examiner* — Vinh Nguyen
(74) *Attorney, Agent, or Firm* — Wood, Phillips, Katz, Clark & Mortimer

(57) ABSTRACT

A system for measuring phase attributes of high voltage electrical lines comprises first and second high voltage probes. Each of the probes comprises a sensing element for selectively measuring voltage of a high voltage electrical line, a processing device for detecting zero crossings of the measured voltage and applying a time tag to the zero crossings, and storing samples of the amplitude and time tagged zero crossings. A transceiver transmits storage samples. A user interface device is remote from the first and second high voltage probes and comprises a transceiver for receiving transmitted storage samples. A memory stores received samples of the time tagged zero crossings for the first and second high voltage electrical lines. A processor is operatively associated with the memory for determining phase relationships between the first and second high voltage electrical lines. A display displays the phase relationships.

20 Claims, 6 Drawing Sheets

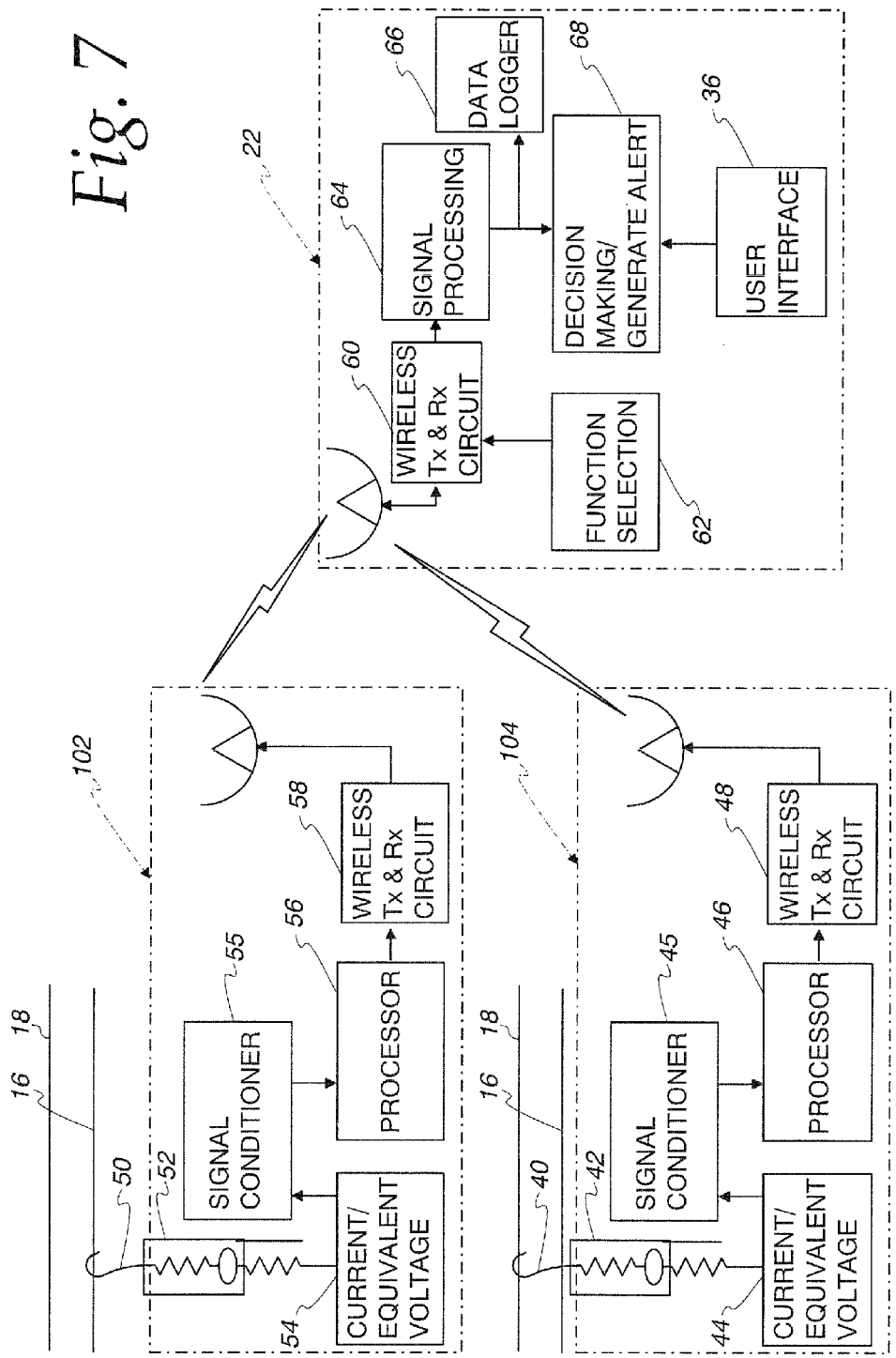

SYSTEM AND METHOD FOR WIRELESS REMOTE DISPLAY FOR HIGH VOLTAGE LINE METER

CROSS-REFERENCE TO RELATED APPLICATIONS

Not Applicable.

FEDERALLY SPONSORED RESEARCH OR DEVELOPMENT

Not Applicable.

MICROFICHE/COPYRIGHT REFERENCE

Not Applicable.

FIELD

The present disclosure relates to a high voltage line meter using a wireless remote display.

BACKGROUND

Electrical power distribution systems often include overhead electrical power distribution lines mounted upon poles by a wide variety of mounting structure. Other distribution systems include underground distribution lines in which protected cables run under the ground surface. High voltage phasing meters are designed for use as safety tools by maintenance line workers to verify the status voltage and phase of the grid lines, phase angle between the lines and also phase sequencing. Even though feeder circuits in utility lines are intended to be well balanced in the initial deployment, one of the phases may turn out to be more heavily loaded than others. This leads to load imbalances.

Known high voltage phasing meters comprise high resistance reference and meter probes connected in series with a calibrated panel meter to read the voltage across the phase-to-phase or phase-to-ground terminals. They are designed for use as safety tools by high voltage line maintenance workers to verify the status of the line or equipment as nominal, induced or de-energized. Known devices for providing such measurements include contact type and non-contact cordless type. With contact type a reference probe or transmitter and a meter probe or receiver are connected in series with a cable as the loop is closed with load terminals. With the non-contact cordless type each probe has a meter and the probes close the circuit through wireless means.

The available meters have different features depending on the particular application. These meters may be used for voltage detection, phase measurement, phase sequence identification, and/or testing for induced or live power lines or equipment. For maintenance of overhead power transmission lines, a worker has to reach the live line, hook the probe onto the line, and read the meter to know the status. The probes are very short in length and need to be extended with hot sticks. The line worker holds these hot stick and hooks the meter to the power line for detection and/or measurement. Inadequate lighting and distance from the meter can make it very difficult to read. The meters do not have capacity for storing the diagnostic data for analysis. Even with non-contact cordless type meters, the reading must be taken during maintenance.

SUMMARY

As disclosed herein, a high voltage line meter uses a wireless remote display.

Broadly, a system for measuring phase attributes of high voltage electrical lines comprises first and second high voltage probes. Each of the probes comprises a sensing element for selectively receiving a voltage signal for a high voltage electrical line and developing a measured signal, a processing device for detecting zero crossings of the measured signal and applying a time tag to the zero crossings, and storing samples of the measured signal and time tagged zero crossings. A transceiver transmits stored samples. A user interface device is remote from the first and second high voltage probes and comprises a transceiver for receiving transmitted stored samples. A memory stores received samples of the time tagged zero crossings for the first and second high voltage electrical lines. A processor is operatively associated with the memory for determining phase relationships between the first and second high voltage electrical lines. A display displays the phase relationships.

It is a feature that the first and second high voltage probes communicate independently with the user device.

It is another feature that the first high voltage probe transmits stored samples for the first high voltage electrical line to the second high voltage probe and the second high voltage probe transmits stored samples for the first and second high voltage electrical lines to the user interface device.

It is a further feature that the user interface device selectively displays any one of the phase measurements, voltage measurements, and phase sequences.

It is still another feature that the user interface device communicates bidirectionally with the probes to enable selection of functionality using the user interface device.

It is still a further feature that the first high voltage probe comprises a reference probe and the second high voltage probe comprises a meter probe.

It is yet another feature that the first high voltage probe is the same as the second high voltage probe and each of the probes has a unique identifier.

It is a further feature that the transmitters communicate using Zigbee based communication or using internet protocol.

It is an additional feature that the user interface device is adapted to transfer received samples to network devices using internet protocol.

There is also disclosed herein a method for measuring phase attributes of high voltage electrical lines comprising measuring voltage of a first high voltage electrical line using a first high voltage probe comprising a sensing element developing a signal, a processing device for detecting zero crossings of the signal, applying a time tag to the zero crossings, and storing samples of the signal and time tagged zero crossings, and transmitting stored samples; measuring voltage of a second high voltage electrical line using a second high voltage probe comprising a sensing element developing a signal, a processing device for detecting zero crossings of the signal, applying a time tag to the zero crossings, and storing samples of the signal and time tagged zero crossings, and transmitting stored samples; and a user interface device remote from the first and second high voltage probe and for receiving transmitted stored samples, for storing received samples of the time tagged zero crossings for the first and second high voltage electrical lines, for determining phase relationships between the first and second high voltage electrical lines and for displaying the phase relationships.

Other features and advantages will be apparent from a review of the entire specification, including the appended claims and drawings.

BRIEF DESCRIPTION OF THE DRAWINGS

FIG. 7 is a block diagram for the systems of FIGS. 4 and 5.

DETAILED DESCRIPTION

Figure 1:
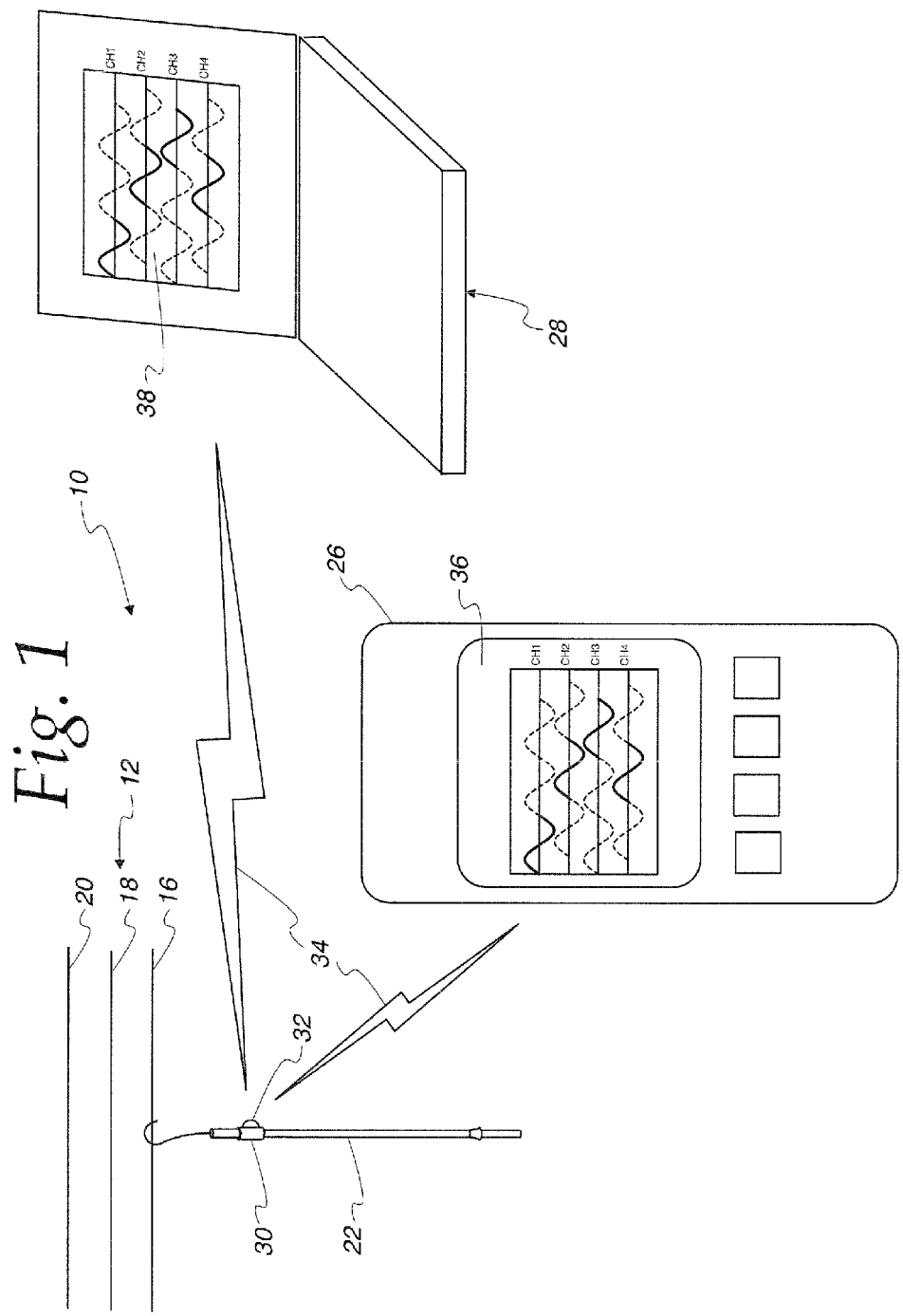
FIG. 1 is a generalized diagram of a system for wireless remote display for a high voltage line meter.

Referring initially to FIG. 1, a system 10 is used for measuring phase attributes of a high voltage transmission line system 12 and adapted for wireless remote display. Particularly, the system 10 is used for measuring phase-to-phase voltage and other phase attributes of the high voltage transmission line system 12. The transmission line system 12 includes three conductor lines 16, 18 and 20 carrying high voltage power of alternating current with each line being 120° out of phase with the other lines, as is conventional.

Figure 2:
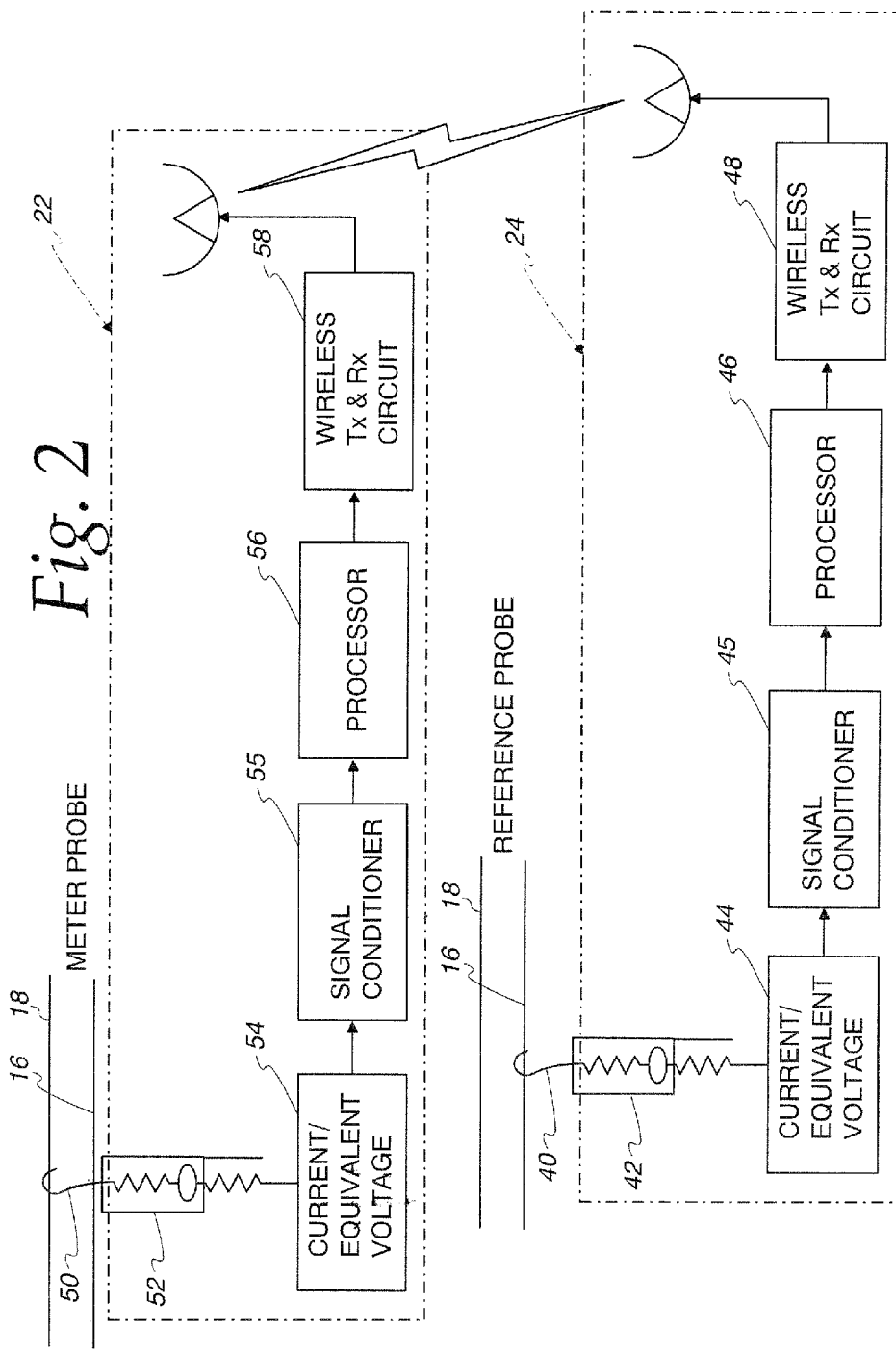
FIG. 2 is a block diagram of communication between a reference probe and a meter probe.

The system 10 includes a meter probe 22 and a reference probe 24, see FIG. 2. The system 10 uses a handheld device 26 or remote computing device 28, such as a laptop, PDA, smart phone or the like, for displaying measured variables. The meter probe 22 and the reference probe 24 acquire measured voltage and current attributes, digitize the data and transmit the data to a remote receiver as part of the handheld device 26 or computer 28 for monitoring and logging, as described below.

The meter probe 22 includes a data acquisition module 30 including a wireless transceiver. A conformal microantenna 32 associated with the module 30 is used for wireless communication. The microantenna 32 comprises an omnidirectional antenna. Appropriate selection of frequency for the wireless transceiver could avoid any interaction with high power electromagnetic fields. The handheld device 26 and/or laptop 28 function as user interface devices and would also include a wireless transceiver to communicate with the meter probe 22 as indicated at 34. The user interface devices 26 and 28 are programmed to implement a user interface for selecting functionality such as phase measurement, voltage measurement, phase sequence detection, phase-to-phase or phase to ground voltage, etc. and select a critical parameter to observe using respective displays 36 and 38. The user interface devices 26 and 28 can generate alert messages and sounds based on the set functionality. The user interface devices 26 and 28 receive data, compute phase attributes and display the phase attributes in real time, generates report, and stores the data for future analysis.

Referring to FIG. 2, the reference probe 24 comprises an electrode 40 for selectively measuring voltage or current of a high voltage electrical line, for example the first line 16. The electrode 40 is connected to a high voltage resistor 42 to form a sensing element developing a sinusoidal AC signal representing measured voltage or current. The high voltage resistor 42 is coupled to a current/equivalent voltage circuit 44. The circuit 44 acquires the drop current, comprising the sinusoidal waveform with measurement noise, form the high voltage power line 16. A signal conditioning circuit 45 performs signal conditioning of the sinusoidal AC signal. A processor block 46 includes a processing circuit that receives the conditioned signal. The processor 46 filters the signal to suppress surge current, parasitic capacitive current, electromagnetic interference and electromagnetic coupling and anti-aliasing. The filtered signal is converted to digital form and zero crossing points are detected. A reference time clock time tags the zero crossing points. A processor memory stores samples of the digitized signal and time tagged zero crossings. The samples are also tagged with an identifier representing the line or the probe. A wireless transceiver 48 is adapted for transmitting stored samples to the meter probe 22.

The meter probe 22 comprises an electrode 50 for selectively measuring voltage or current of the high voltage electrical line, for example the second line 18. The electrode 50 is connected to a high voltage resistor 52 to form a sensing element developing a sinusoidal AC signal representing measured voltage or current. The high voltage resistor 52 is coupled to a current/equivalent voltage circuit 54, similar to the circuit 44 discussed above. A signal conditioning circuit 55 performs signal conditioning of the sinusoidal AC signal. A processor 56 receives the conditioned signal. The processor 56 is similar to the processor 46 discussed above. A wireless transceiver 58 is adapted for receiving stored samples from the reference probe 24.

In the illustrated embodiment, the reference probe 24 is configured as a transmit system with the transceiver 48 operating only as a transmitter. The meter probe 24 is configured as a receive device with the transceiver 58 acting only as a receiver relative to the reference probe 24. In this embodiment, the meter probe processor 56 is adapted to store the samples from the sensing element 50 as well as samples received from the reference probe 24. The meter probe 22 in this sense operates as a data acquisition device for the system 10. The meter probe 22 may also be configured to include data logging capability.

Figure 3:
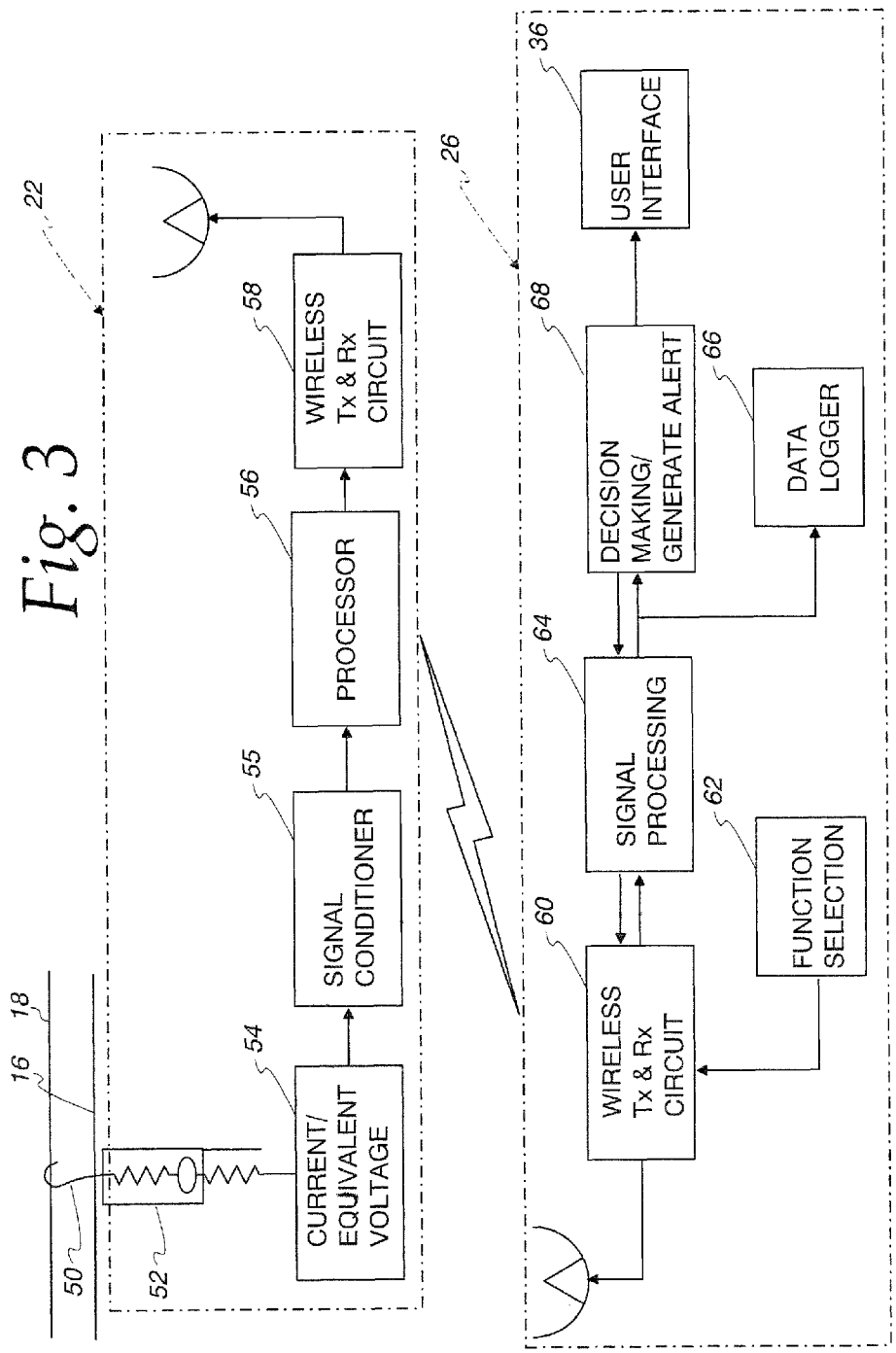
FIG. 3 is a block diagram illustrating communication between a meter probe and a user interface device.

Referring to FIG. 3, the meter probe 22 is adapted to transmit stored samples for both the first and the second high voltage lines 16 and 18 to the user interface device, such as the handheld device 26. The handheld device 26 includes a transceiver 60 enabling bidirectional wireless communication with the meter probe transceiver 58. A function selection block 62 is coupled to the transceiver 60. The function selection block 62 enables the user to select a desired function of operation for transfer to the meter probe 22. A signal processing block 64 receives the stored samples from the transceiver 60 and includes a memory for storing the received samples of the time tagged zero crossings for the first and second high voltage electrical lines 16 and 18 in the illustrated example. The signal processing block 64 includes a processor and associated memory. The processor is programmed to determine phase relationships between the lines 16 and 18. A data logger block 66 is used for storing a log of the phase relationships. A decision block 68 determines if the measured attributes are outside of a desired range for generating alerts. The decision block 68 is coupled to the user interface 36 for displaying the data for selected function.

The transceivers 48, 58 and 60 comprise Zigbee communication transceivers having a range of 10 to 200 feet. This range is extendable. Alternatively, Wi-Fi communications or the like could also be used for short range communications.

The use of the display 36 remotely on the user interface device 26 avoids the necessity of field workers staying near the high voltage lines, which could be hazardous, and ensures easy reading, function selection, report generation and operations. Also, a co-worker could read the parameters and alert messages concurrently with a line worker taking the measurements. The data logging feature enables analysis and decision making at a later time.

The use of wireless communications overcomes the difficulty of continuously holding a hot stick and looking at the meter as with prior systems. Likewise, the use of the handheld device 26 or laptop 28, or the like, enables retransmission of data to a monitoring station. The probes 22 and 24 could be fixed to the power lines or equipment and the worker could then move around and monitor transmission lines using the handheld device 26. Moreover, the handheld device 26 could be configured for continuous monitoring without manual intervention.

Figure 4:
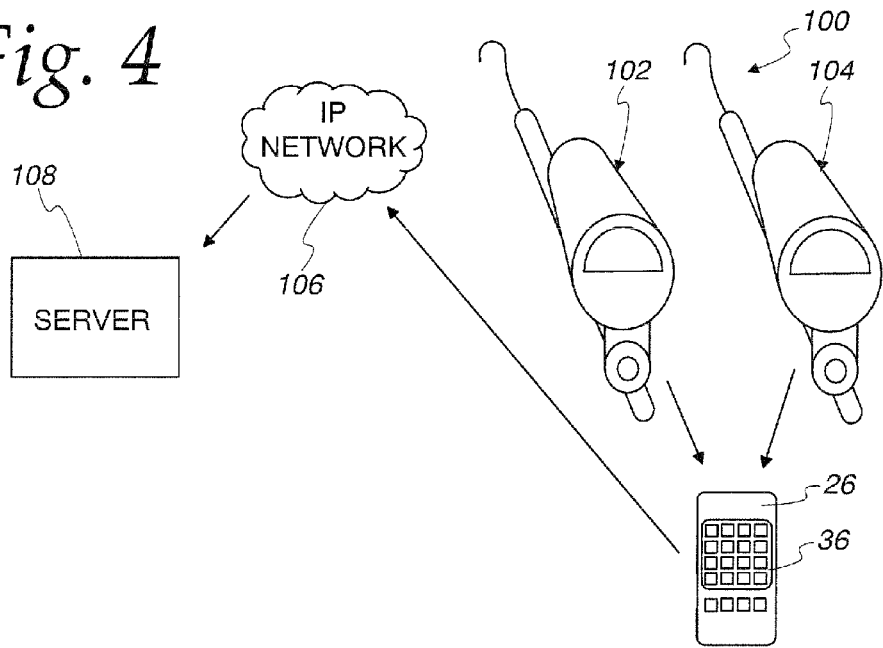
FIG. 4 is a generalized diagram illustrating a system for wireless remote display in accordance with another embodiment.

Referring to FIG. 4, an alternative system 100 is used for measuring phase attributes of high voltage electric lines using a wireless remote display. In this embodiment, the system 100 uses a first probe 102 and a second probe 104 which are identical in construction. Each is adapted for two way communications with the handheld device 26. The handheld device 26 can further communicate via an Internet protocol (IP) network 106, or the like, with a remote server 108.

Figure 5:
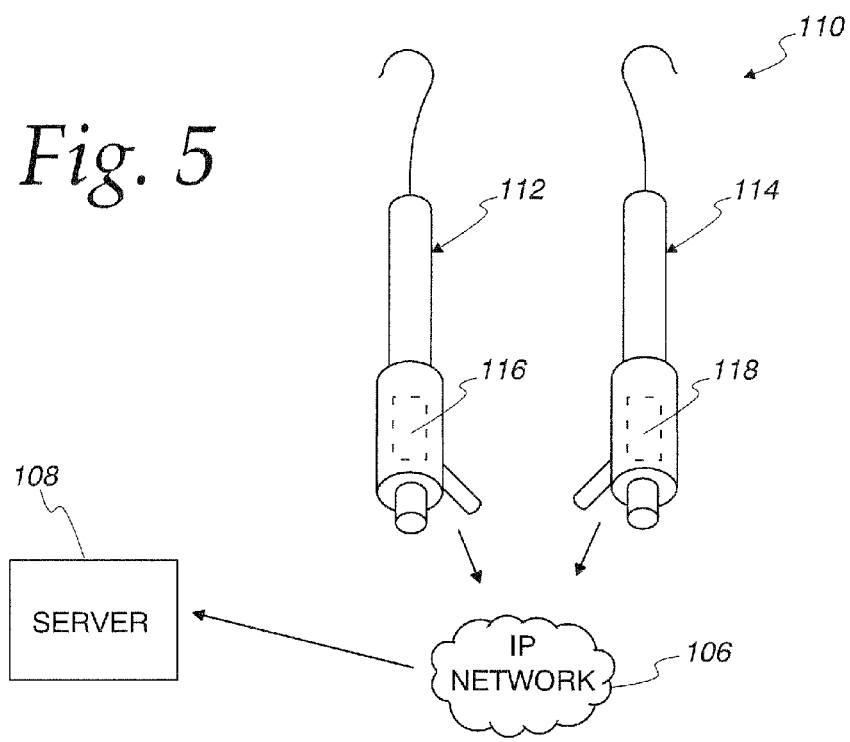
FIG. 5 is a generalized diagram illustrating a system for wireless remote display in accordance with still another embodiment.

Referring to FIG. 5, a further alternative system 110 is used for measuring phase attributes of high voltage electric lines using a wireless remote display. In this embodiment, the system 110 includes a first probe 112 and second probe 114. Each of the probes 112 and 114 includes a hardware circuit module 116 and 118, respectively. The modules 116 and 118 enable IP communications directly with the IP network 106 for communication with the server 108.

In the embodiment of FIG. 4, the handheld device 26 is adapted to turn the system on and off and enable or disable probe operation as well as provide for function selection, range selection and a peak hold circuit. The handheld device 26 uses processor base logic for phase ID, voltage detection and phase sequencing. Logging is provided by a phase ID parameter with a grid ID and time stamp. The display 36 displays phase ID and computed parameters. The wireless interface between the probes 102 and 104 and the handheld device 26 can be Zigbee based communication or Wi-Fi base communication, or the like, as desired. The handheld device 26 may include the interface option to communicate over a greater distance with remote devices such as the server 108, through IP communication.

In the embodiment of FIG. 5, the hardware circuit modules 116 and 118 include electronic switches to select functional modes, analog signal processing, digitization of AC signal, zero crossing detection and Offset Quadrature Phase Shift Keying (QPSK) modulation, or the like, for transmission of signals.

Figure 6:
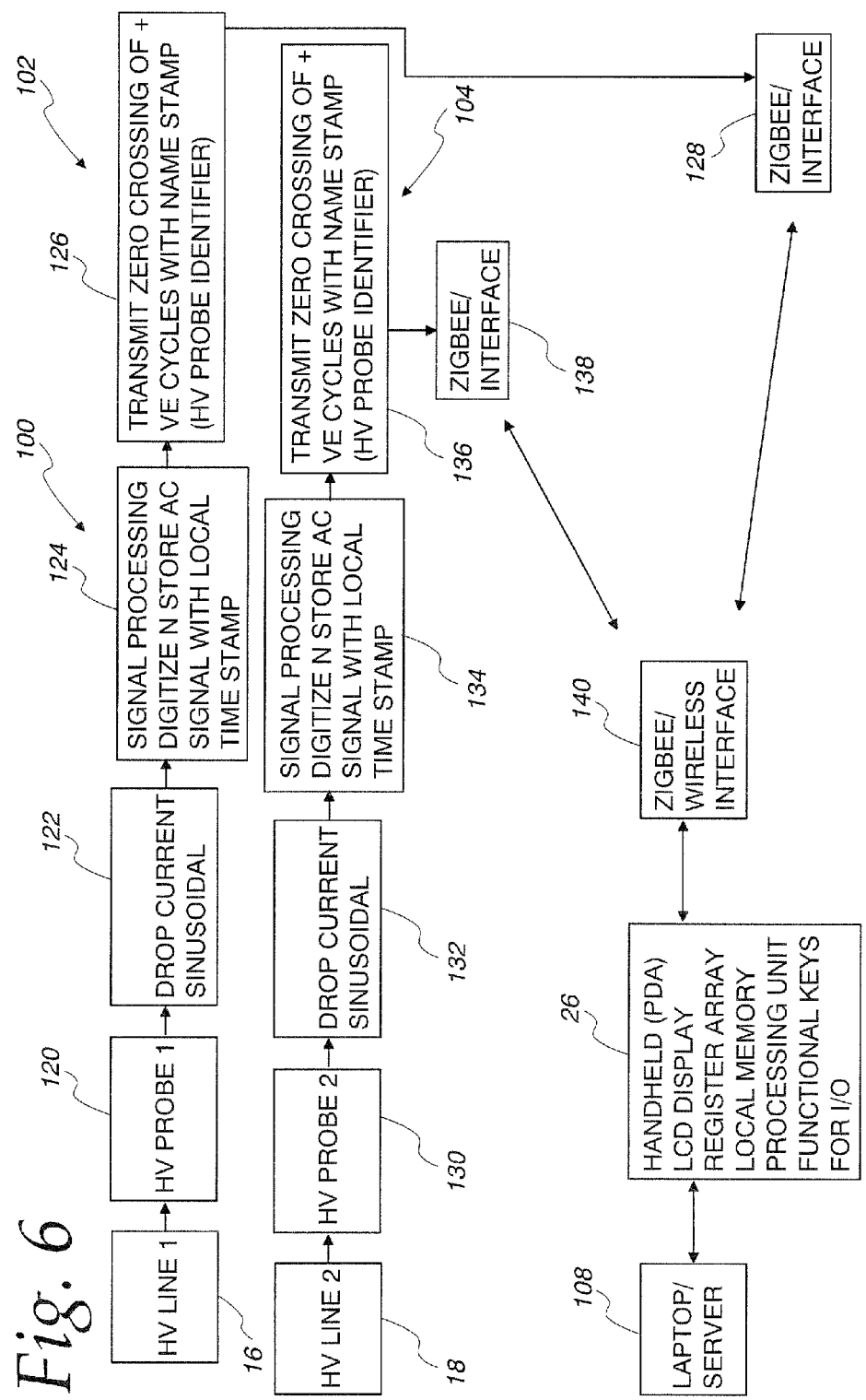
FIG. 6 is a block diagram illustrating the system and method for wireless remote display using the embodiments of FIGS. 4 and 5.

Referring to FIG. 6, a flow diagram illustrates architecture of the system 100 of FIG. 4 using homogenous probes with a handheld device 26 for phase ID. As will be apparent, the system 110 of FIG. 5 would be generally similar other than the communications and construction of probes without the housing.

The first probe 102 includes a high voltage probe circuit 120 as a sensing element for measuring voltage of a high voltage electrical line, such as the line 16. The probe circuit 120 includes an electrode and high voltage resistor, as discussed in the embodiment above. The probe circuit 120 is coupled to a drop current block 122 which acquires the drop current from the high voltage power line 16 and performs signal conditioning of the sinusoidal AC signal. A signal processing block 124 digitizes the AC signal and stores the zero crossings with a local time stamp, as above. A transmit block 126 transmits the stored samples of the amplitude and time tagged zero crossings using a Zigbee transceiver 128 to the handheld device 26.

The second probe 104 is identical to the first probe 102 including a probe circuit 130, a drop current block 132, a signal processing block 134, a transmit block 136 and a transceiver 138.

The handheld device 26 includes a transceiver 140 for receiving the stored samples from the first probe 102 and the second probe 104. Particularly, the transceiver 140 receives raw data from the probes 102 and 104. The transceiver 140 is configured as a module for the handheld device 26 which may be configured as illustrated above relative to FIG. 3. The handheld device 36 can likewise communicate with a laptop/server or the like 108, over an IP network 106 or using other forms of communication, as necessary.

In this embodiment, the system 100 is described as using Zigbee communication. However, Wi-Fi or other forms of communication could also be used.

FIG. 7 is a block diagram which illustrates the system of FIG. 4 similarly to that shown for the system 10 in FIGS. 2 and 3. As such, similar reference numerals are used. The one difference is that in the system 10 of FIG. 2, the reference probe transmitted samples to the meter probe 22 which in turn communicated with the handheld device 26, see FIG. 3. In the embodiment of FIG. 7, both probes 102 and 104 comprise homogenous probes and transmit samples directly to the handheld device 26.

With the systems 100 and 110 of FIGS. 4 and 5, both of the probes are identical in detecting and processing signals of the associated power line. Each probe transmits the time tagged data over a wireless transceiver in a transmit mode. The remote handheld device receives the time stamped data for both probes. Algorithms and application software running in the handheld device 26 or the server 108 compare the phase relationships between both the signals and computes phase angle and additional features such as voltage detection, phase angle measurement, device control such as on and off, functional mode selection and application mode selection such as underground line or overhead line and drives the LCD display 36 to display the selected parameters.

The data transmitted through the wireless or Zigbee interface to the handheld device 26 could be routed through a public network such as cellular, internet or the like, as will be apparent.

It will be appreciated by those skilled in the art that there are many possible modifications to be made to the specific forms of the features and components of the disclosed embodiments while keeping within the spirit of the concepts disclosed herein. Accordingly, no limitations to the specific forms of the embodiments disclosed herein should be read into the claims unless expressly recited in the claims. Although a few embodiments have been described in detail above, other modifications are possible. For example, the logic flows depicted in the figures do not require the particular order shown, or sequential order, to achieve desirable results. Other steps may be provided, or steps may be eliminated, from the described flows, and other components may be added to, or removed from, the described systems. Other embodiments may be within the scope of the following claims.

The present invention has been described with respect to flowcharts and block diagrams. It will be understood that each block of the flowchart and block diagrams can be implemented by computer program instructions. These program instructions may be provided to a processor to produce a machine, such that the instructions which execute on the processor create means for implementing the functions specified in the blocks. The computer program instructions may be executed by a processor to cause a series of operational steps to be performed by the processor to produce a computer implemented process such that the instructions which execute on the processor provide steps for implementing the functions specified in the blocks. Accordingly, the illustrations support combinations of means for performing a specified function and combinations of steps for performing the specified functions. It will also be understood that each block and combination of blocks can be implemented by special purpose hardware-based systems which perform the specified functions or steps, or combinations of special purpose hardware and computer instructions.

The invention claimed is:

1. A system for measuring phase attributes of high voltage electrical lines comprising:
   a first high voltage probe comprising a sensing element for selectively measuring voltage or current of a first high voltage electrical line and developing a measured signal, a processing device for detecting zero crossings of the measured signal, applying a time tag to the zero crossings, and storing samples of the measured signal and time tagged zero crossings, and a transceiver for transmitting stored samples of the measured signal and time tagged zero crossings;
   a second high voltage probe comprising a sensing element for selectively measuring voltage of a second high voltage electrical line and developing a measured signal, a processing device for detecting zero crossings of the measured signal, applying a time tag to the zero crossings, and storing samples of the measured signal and time tagged zero crossings, and a transceiver for transmitting stored samples of the measured signal and time tagged zero crossings; and
   a user interface device remote from the first and second high voltage probes and comprising a transceiver for receiving transmitted stored samples of the measured signals and time tagged zero crossings, a memory for storing received samples of the time tagged zero crossings for the first and second high voltage electrical lines, a processor operatively associated with the memory for determining phase relationships between the first and second high voltage electrical lines and a display for displaying the phase relationships.

2. The system for measuring phase attributes of high voltage electrical lines of claim 1 wherein the first and second high voltage probes communicate independently with the user interface device.

3. The system for measuring phase attributes of high voltage electrical lines of claim 1 wherein the first high voltage probe transmits stored samples for the first high voltage electrical line to the second high voltage probe and the second high voltage probe transmits stored samples for the first and the second high voltage electrical line to the user interface device.

4. The system for measuring phase attributes of high voltage electrical lines of claim 1 wherein the user interface device selectively displays any one of phase measurements, voltage measurements, and phase sequences.

5. The system for measuring phase attributes of high voltage electrical lines of claim 1 wherein the user interface device communicates bidirectionally with the probes to enable selection of functionality using the user interface device.

6. The system for measuring phase attributes of high voltage electrical lines of claim 1 wherein the first high voltage probe comprises a reference probe and the second high voltage probe comprises a meter probe.

7. The system for measuring phase attributes of high voltage electrical lines of claim 1 wherein the first high voltage probe is the same as the second high voltage probe and each of the first high voltage probe and the second high voltage probe has a unique identifier.

8. The system for measuring phase attributes of high voltage electrical lines of claim 1 wherein the transceivers communicate using Zigbee based communication.

9. The system for measuring phase attributes of high voltage electrical lines of claim 1 wherein the transceivers communicate using internet protocol.

10. The system for measuring phase attributes of high voltage electrical lines of claim 1 wherein the user interface device is adapted to transfer received samples to network devices using internet protocol.

11. A method for measuring phase attributes of high voltage electrical lines comprising:
    measuring voltage of a first high voltage electrical line using a first high voltage probe comprising a sensing element developing a signal, a processing device for detecting zero crossings of the signal, applying a time tag to the zero crossings, and storing samples of the signal and time tagged zero crossings, and transmitting stored samples of the signal and time tagged zero crossings;
    measuring voltage of a second high voltage electrical line using a second high voltage probe comprising a sensing element developing a signal, a processing device for detecting zero crossings of the signal, applying a time tag to the zero crossings, and storing samples of the signal and time tagged zero crossings, and transmitting stored samples of the measured signal and time tagged zero crossings; and
    using a user interface device remote from the first and second high voltage probe and for receiving transmitted stored samples of the measured signal and time tagged zero crossings, for storing received samples of the time tagged zero crossings for the first and second high voltage electrical lines, for determining phase relationships between the first and second high voltage electrical lines and for displaying the phase relationships.

12. The method for measuring phase attributes of high voltage electrical lines of claim 11 wherein the first and second high voltage probes communicate independently with the user interface device.

13. The method for measuring phase attributes of high voltage electrical lines of claim 11 wherein the first high voltage probe transmits stored samples for the first high voltage electrical line to the second high voltage probe and the second high voltage probe transmits stored samples for the first and the second high voltage electrical line to the user interface device.

14. The method for measuring phase attributes of high voltage electrical lines of claim 11 wherein the user interface device selectively displays any one of phase measurements, voltage measurements, and phase sequences.

15. The method for measuring phase attributes of high voltage electrical lines of claim 11 wherein the user interface device communicates bidirectionally with the probes to enable selection of functionality using the user interface device.

16. The method for measuring phase attributes of high voltage electrical lines of claim 11 wherein the first high voltage probe comprises a reference probe and the second high voltage probe comprises a meter probe.

17. The method for measuring phase attributes of high voltage electrical lines of claim 11 wherein the first high voltage probe is the same as the second high voltage probe and each of the first high voltage probe and the second high voltage probe has a unique identifier.

18. The method for measuring phase attributes of high voltage electrical lines of claim 11 wherein the transceivers communicate using Zigbee based communication.

19. The method for measuring phase attributes of high voltage electrical lines of claim 11 wherein the transceivers communicate using internet protocol.

20. The method for measuring phase attributes of high voltage electrical lines of claim 11 wherein the user interface device is adapted to transfer received samples to network devices using internet protocol.

\* \* \* \* \*